United States Patent [19]
Uscategui et al.

[11] Patent Number: 5,789,982
[45] Date of Patent: Aug. 4, 1998

[54] LOW DISTORTION FEEDBACK IC AMPLIFIER AND METHOD

[75] Inventors: Gabriel J. Uscategui, West Melbourne; Glenn Wells, Palm Bay, both of Fla.

[73] Assignee: Harris Corporation, Melbourne, Fla.

[21] Appl. No.: 712,562

[22] Filed: Sep. 11, 1996

Related U.S. Application Data

[63] Continuation-in-part of Ser. No. 502,636, Jul. 14, 1995, abandoned.
[51] Int. Cl.$^6$ .................... H03F 3/45; H03F 3/30
[52] U.S. Cl. .................... 330/255; 330/267; 330/310
[58] Field of Search .................... 330/255, 263, 330/265, 267, 268, 310, 311

[56] References Cited

U.S. PATENT DOCUMENTS

| | | | |
|---|---|---|---|
| 4,555,672 | 11/1985 | Segal | 330/255 |
| 5,150,074 | 9/1992 | Gosser | 330/263 |
| 5,218,321 | 6/1993 | Jost | 330/263 |

FOREIGN PATENT DOCUMENTS

| | | | |
|---|---|---|---|
| 2121633 | 12/1983 | United Kingdom | 330/267 |
| 2224900 | 5/1990 | United Kingdom | 330/267 |

*Primary Examiner*—James B. Mullins
*Attorney, Agent, or Firm*—Rogers & Killeen

[57] ABSTRACT

Circuits and methods to minimize total harmonic distortion in an integrated circuit feedback amplifier. Complementary transistors in the signal path are selected so that their base-to-collector capacitances are matched. Additionally, the DC operating currents of such transistors are matched, thereby cancelling non-linearities due to base-to-collector capacitances.

33 Claims, 2 Drawing Sheets

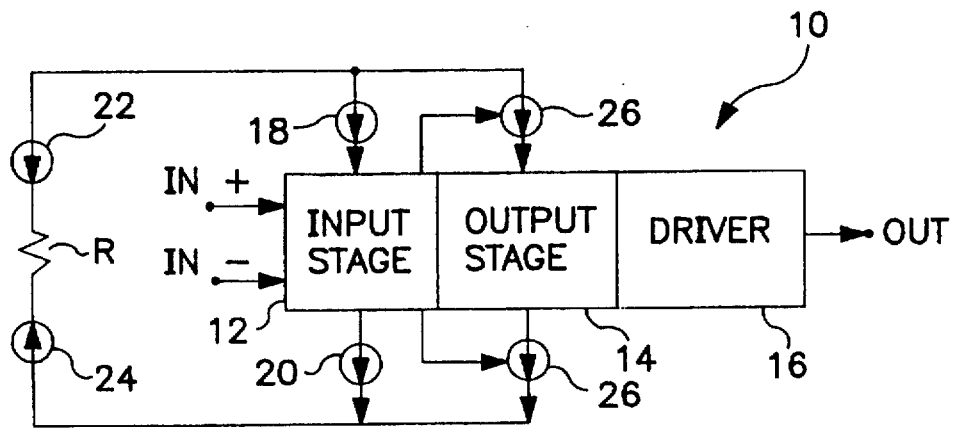
FIG. 1
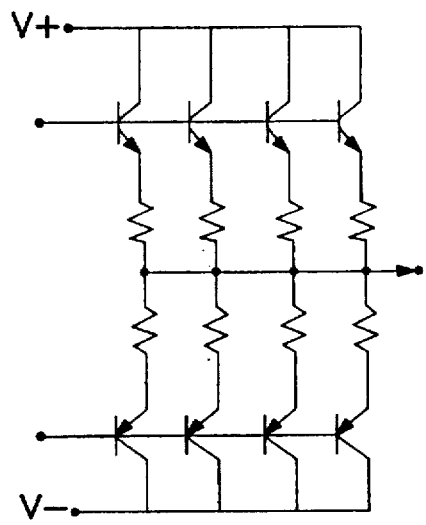
FIG. 3
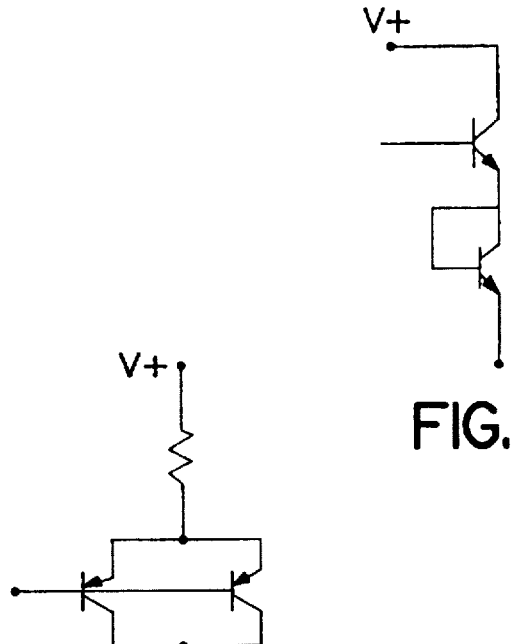
FIG. 4
FIG. 5

LOW DISTORTION FEEDBACK IC AMPLIFIER AND METHOD

This is a continuation-in-part application of application Ser. No. 08/502,636 filed Jul. 14, 1995, now abandoned, and assigned to the assignee hereof.

BACKGROUND OF THE INVENTION

The present invention relates to integrated circuit feedback amplifiers with complementary transistors, and more particularly to the reduction of total harmonic distortion in such amplifiers.

Integrated circuit feedback amplifiers with complementary transistor are well known. In such amplifiers, it is known to balance the operating currents and $V_{be}S$ of the complementary matched pairs of transistors in the input stage for considerations other than reducing the total harmonic distortion.

In such amplifiers, it has been a general practice to minimize the die area by sizing the output transistors to provide the required output current without saturation. Using conventional complementary bipolar silicon processes, the inherently larger bulk collector resistivity of the PNP transistors has resulted in PNP transistors which are larger in size than the complementary NPN transistors. This difference in size between the NPN and PNP transistors in turn has resulted in significant imbalances between the base-to-collector capacitances of the NPN and PNP transistors and has resulted in significant distortion.

It is accordingly an object of the present invention to obviate much of the total harmonic distortion of known integrated circuit, complementary transistor amplifiers and to provide a novel method and amplifier in which the total harmonic distortion has been significantly reduced.

In one aspect, the present invention provides a novel amplifier and method in which the base-to-collector capacitance of the complementary transistors in the output stage are closely matched.

In another aspect, the present invention provides a novel amplifier and method in which the complementary transistors in the output stage are sized so that their base-to-collector capacitances are closely matched.

In still another aspect, the present invention provides a novel amplifier and method in which the current sources and sinks associated with the complementary transistors in the output stage are closely matched.

It is another object of the present invention to provide a novel amplifier and method in which the complementary transistors in the output stage are closely matched to the transistors of the driver stage in base-to-collector capacitance, quiescent current and voltage dependant junction capacitance.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a schematic block diagram of one embodiment of the amplifier of the present invention.

FIG. 3 is a schematic circuit diagram of a second embodiment of the driver stage of the circuit of FIG. 2.

FIG. 4 is a schematic circuit diagram of a second embodiment of the dynamic current source of the circuit of FIG. 2.

FIG. 5 is a schematic circuit diagram of a second embodiment of the voltage clamp of the circuit of FIG. 2.

DESCRIPTION OF PREFERRED EMBODIMENTS

Figure 2:
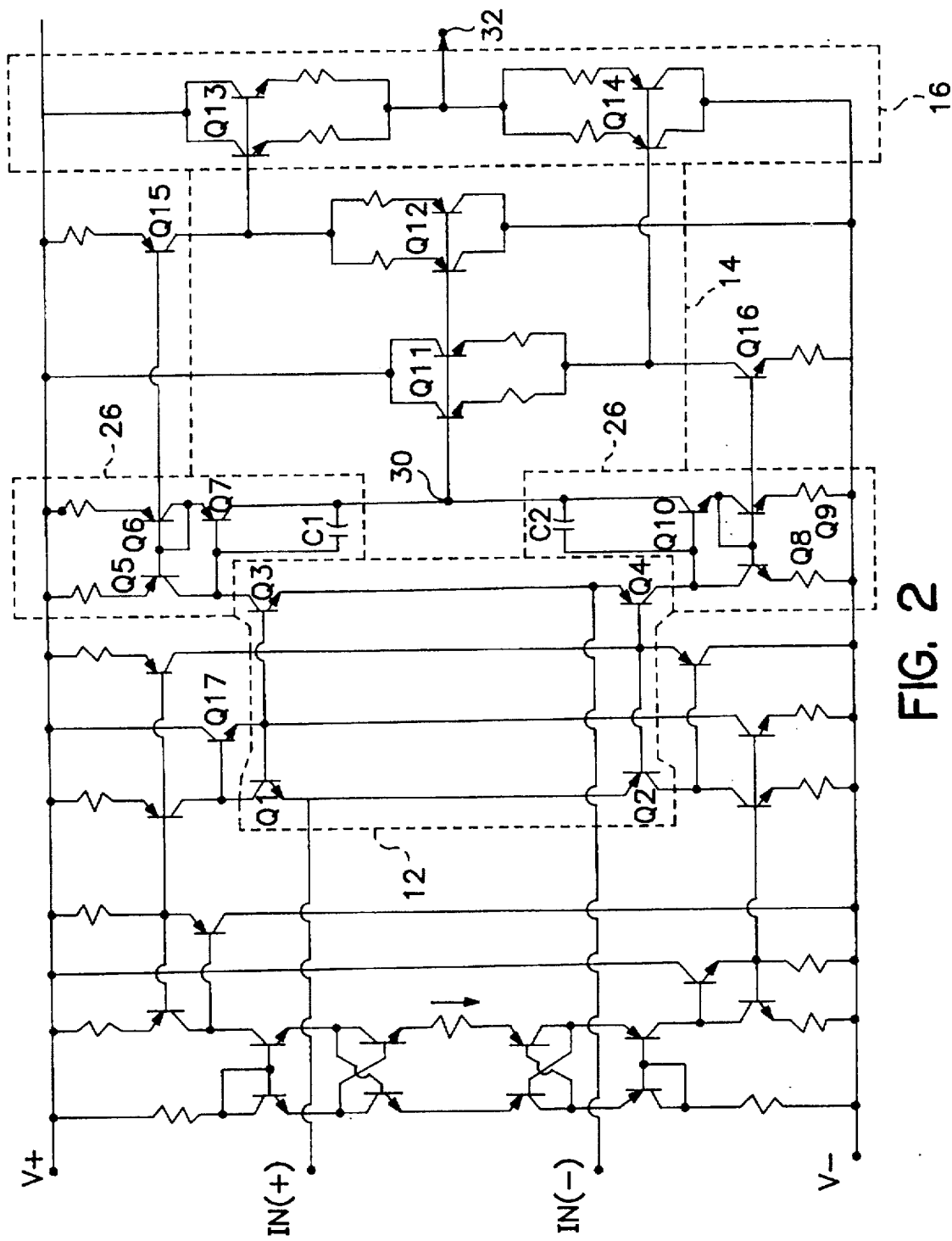
FIG. 2 is a schematic circuit diagram of one embodiment of the amplifier of FIG. 1 implemented using bipolar junction transistors.

FIG. 1 illustrates one embodiment of a current feedback amplifier of the present invention. With reference to FIG. 1, the amplifier 10 comprises input, output and driver stages 12, 14 and 16 respectively each, with both input and output stages connected to both a current source and to current sink. The current sources and sinks of the three stages, together with the current source 22 and current sink 24, provide the bias network for the amplifier.

Because the current provided by the source 22 and the sink 24 pass through the same resistor R, the output current therefrom is the same. The current through the source 18 is slaved to that of the source 22, as is the current through the sink 20 to the sink 24. In this way, the currents applied to the input stage of the amplifier 10 are equal.

Both positive and negative input signals are applied to the input stage, and the positive and negative output signals therefrom are applied through a current mirror 26 to the output stage 14 which in turn provides the input signal to the high impedance node of the driver stage 16.

The amplifier of FIG. 1 may be implemented using integrated circuit, complementary bipolar transistors as shown in FIG. 2. With reference to FIG. 2, the input stage may comprise NPN transistor Q1 and PNP transistor Q2 on the positive side and NPN transistor Q4 and PNP transistors Q3 on the negative side.

One half of the output signal from the input stage is taken from the collector of the transistor Q3 may be applied to a conventional Wilson current mirror 26 comprising transistors Q5, Q6 and Q7 with a frequency compensating capacitor C1 to stabilize the amplifier and set bandwidth. Similarly, the other half of the output signal from the input stage 12 may be taken from the collector of the transistor Q4 and may be applied to a second conventional Wilson current mirror 26 comprising transistors Q8, Q9 and Q10 with a frequency compensating capacitor C2 to stabilize the amplifier and set bandwidth.

The two current mirrors 26 feed a common high impedance node 30 which serves as the single input terminal for the output stage 14. As shown in FIG. 1, the output stage 14 comprises one or more parallel NPN transistors Q11 and one or more parallel PNP transistors Q12, all receiving the signal from the input node 30 of the base thereof.

One half of the output signal from the output stage 14 is applied to one or more parallel NPN transistors Q13 to provide the output signal from the amplifier 10 on the terminal 32. The other half of the output signal from the output stage 14 is applied to one or more parallel PNP transistors Q14 to provide the output signal from the amplifier 10 on the terminal 32.

The transistors Q15 and Q16, while part of the bias network and providing a source of current for the output stage 14, have their collector electrodes ties to the signal path.

By matching the voltage dependant capacitances of the output stage NPN transistors Q13 with that of the PNP transistors Q14, and by matching the base-to-collector capacitances of NPN transistor Q11 with that of PNP transistor Q12, and by matching the base-to-collector capacitances of PNP transistor current source Q15 with that of the NPN transistor current source Q16, and by proportionally matching the quiescent current of PNP transistor current source Q15 with that of NPN transistor current sink Q16, the total harmonic distortion may be significantly reduced as discussed below.

There are two major sources of distortion in amplifiers. The first of these is the non-linearity in the exponential term that relates the collector current to the base-to-emitter voltage of the bipolar transistors.

$$I_c = I_s \cdot e^{\frac{v_{be}+V_{be}}{V_T}} \quad (1)$$

where $I_s$ is the saturation current;

$V_{be}$ is the dynamic component of the base-to-emitter voltage;

$V_{be}$ is the direct voltage component of the base-to-emitter voltage; and $V_T$ is the thermal voltage.

The other major source of distortion is the distortion associated with the non-linear base-to-collector capacitances, i.e.,:

$$C_{bc} = \frac{C_{bco}}{\sqrt{1 - \frac{V_{bc} + v_{bc}}{\Psi}}} \quad (2)$$

where $C_{bc}$ is the base-to-collector junction capacitance at zero voltage;

$V_{bc}$ is the direct voltage component of the base-to-collector voltage;

$v_{bc}$ is the dynamic component of the base-to-collector voltage; and $\Psi$ is the built in potential of the base-to-collector junction.

To minimize the components of the base-to-collector capacitance, the dynamic currents $i_{bc}$ through the $C_{bc}$ capacitors must be identical. Such dynamic currents may be expressed as follows:

$$i_{bc} = C_{bc} \frac{dv_{bc}}{dt} \quad (3)$$

Since the direct currents at the high impedance node 30 at the base of the NPN and PNP transistors Q11 and Q12 of the output stage are equal, the transistors of the output stage may be scaled such that the total base-to-collector capacitance of the NPN and PNP transistors is the same.

The same principle may be used to size the transistors of the second emitter follower of the driver stage 16.

Because the ratio of the base-to-collector capacitance of the NPN/PNP output stage transistors are designed to be 0.8, the ratio of the direct currents of the NPN transistors to the PNP transistors may also be made 0.8. Thus the dV/dt excursions of the base-to-collector junctions are maintained proportionally equal, reducing harmonic distortion.

Simulation results of the circuit shown in FIG. 2, using a closed loop gain of 11 and a 1.0 volt peak sine wave of 2 MHz, show that the lowest harmonic distortion occurs when the junction capacitors are closely matched, i.e., when the ratio of $C_{bc}$(PNP)/$C_{bc}$(NPN) and of Ic(PNP) and Ic(NPN) equal 1.00, the total harmonic distortion ("THD") is −59.8 dB. THD is −57.5 at a ratio of 1.24, −56.2 at a ratio 1.32, and −54.9 at a ratio of 1.46. Amplifiers built using the present invention, at a frequency of 2 MHz and a peak output of 11 volts, have produced a second harmonic ("HD2") of −73 dB and a third harmonic distortion ("HD3") of −66 dB.

While preferred embodiments of the present invention have been described, it is to be understood that the embodiment described is illustrative only. For example, the driver stage may be configured as shown in FIG. 3 where additional power is desired, e.g., a transmitter output capability. Similarly, the transistor Q15 may be replaced with the circuit shown in FIG. 4 and the transistor Q17 may be replaced by the circuit illustrated in FIG. 5.

Where the design of the amplifier requires that the ratio of $C_{bc}$(PNP)/$C_{bc}$(NPN) is other than unity, the dynamic bias of the transistors Q15 and Q16 may be adjusted to the same ration thereby significantly reducing the total distortion in such an unbalanced amplifier configuration.

The scope of the invention is to be defined solely by the appended claims when accorded a full range of equivalence, many variations and modifications naturally occurring to those of skill in the art from a perusal hereof.

What is claimed is:

1. In an integrated circuit feedback amplifier including positive and negative input terminals, an input stage operatively connected to said input terminals, an output stage operatively connected to said input stage, and a driver stage operatively connected to said output stage and having an output terminal, the improvement wherein said driver and said output stages include capacitively balanced complementary transistors.

2. The amplifier of claim 1 wherein the transistors of said input stage operate at the same quiescent current.

3. The amplifier of claim 1 wherein the complementary transistors of said output stage have current sources associated therewith; and wherein the ratio of the current from said current sources to said complementary transistors is proportional to the base-to-collector capacitance of said complementary transistors.

4. The amplifier of claim 1 wherein said driver stage includes plural parallel connected NPN transistors in series with plural parallel connected PNP transistors.

5. The amplifier of claim 4 wherein said driver stage is an emitter follower.

6. The amplifier of claim 1 wherein said output stage includes at least one NPN transistor and at lease one PNP transistor with the bases thereof being directly connected.

7. The amplifier of claim 6 wherein said output stage is an emitter follower.

8. The amplifier of claim 6 wherein said output stage includes at least two parallel NPN transistors and at least two parallel PNP transistors, the bases of all of said transistors being directly connected.

9. The amplifier of claim 1 wherein the transistors are bipolar junction transistors.

10. The amplifier of claim 1 wherein output stage includes at least two parallel NPN transistors and at least two parallel PNP transistors, the bases of all of said transistors being directly connected.

11. In an integrated circuit feedback amplifier including positive and negative input terminals, an input stare operatively connected to said input terminals, an output stage operatively connected to said input stage, and a driver stare operatively connected to said output stage and having an output terminal, the improvement wherein said driver, said output, and said input stages includes capacitively balanced complementary transistors.

12. The amplifier of claim 11 wherein the transistors of said input stage operate at the same quiescent current.

13. The amplifier of claim 12 wherein the complementary transistors of said output stage have current sources associated therewith; and wherein the ratio of the current from said current sources to said complementary transistors is proportional to the base-to-collector capacitance of said complementary transistors.

14. The amplifier of claim 11 wherein the complementary transistors of said output stage have current sources associated therewith; and wherein the ratio of the current from said current sources to said complementary transistors is proportional to the base-to-collector capacitance of said complementary transistors.

15. The amplifier of claim 11 wherein the transistors of said input stage operate at the same quiescent current.

16. The amplifier of claim 11 wherein the complementary transistors of said output stage have current sources associated therewith; and wherein the ratio of the current from said current sources to said complementary transistors is proportional to the base-to-collector capacitance of said complementary transistors.

17. The amplifier of claim 11 wherein said driver stage includes plural parallel connected NPN transistors in series with plural parallel connected PNP transistors.

18. The amplifier of claim 17 wherein said driver stage is an emitter follower.

19. The amplifier of claim 11 wherein said output stage includes at least one NPN transistor and at lease one PNP transistor with the bases thereof being directly connected.

20. The amplifier of claim 19 wherein said output stage is an emitter follower.

21. The amplifier of claim 19 wherein said output stage includes at least two parallel NPN transistors and at least two parallel PNP transistors, the bases of all of said transistors being directly connected.

22. The amplifier of claim 11 wherein the transistors are bipolar junction transistors.

23. The amplifier of claim 11 wherein output stage includes at least two parallel NPN transistors and at least two parallel PNP transistors, the bases of all of said transistors being directly connected.

24. In an integrated circuit feedback amplifier including positive and negative input terminals, an input stage operatively connected to said input terminals, an output stage operatively connected to said input stage, and a driver stage operatively connected to said output stage and having an output terminal, the improvement wherein said driver and said input stages include capacitively balanced complementary transistors.

25. In an integrated circuit feedback amplifier including positive and negative input terminals, an input stage operatively connected to said input terminals, an output stage operatively connected to said input stage, and a driver stage operatively connected to said output stage and having an output terminal, the improvement wherein said input and said output stages include capacitively balanced complementary transistors.

26. The amplifier of claim 25 wherein the transistors of said input stage operate at the same quiescent current;

wherein the complementary transistors of said output stage have current sources associated therewith; and wherein the ratio of the current from said current sources to said complementary transistors is proportional to the base-to-collector capacitance of said complementary transistors.

27. In an integrated circuit feedback amplifier including positive and negative input terminals, an input stage operatively connected to said input terminals, an output stage operatively connected to said input stage, and a driver stage operatively connected to said output stage and having an output terminal, the method of reducing the total harmonic distortion by matching the voltage dependant junction capacitances and operating currents of the input stage, output stage and driver stage transistors.

28. In an integrated circuit feedback amplifier including positive and negative input terminals, an input stage operatively connected to said input terminals, an output stage operatively connected to said input stage, and a driver stage operatively connected to said output stage and having an output terminal, wherein the input and output stages included complementary transistors, the method of reducing the total harmonic distortion by matching the voltage dependant junction capacitances of the input stage and output stage transistors.

29. The method of claim 28 including the further step of closely matching the ratio of the quiescent operating currents of the current sources for the transistors of the output stage to the ratio of the junction capacitances of the transistors.

30. The method of claim 28 including the further step of closely matching the quiescent operating currents of the complementary transistors.

31. In an integrated circuit feedback amplifier including positive and negative input terminals, an input stage operatively connected to said input terminals, an output stage operatively connected to said input stage, and a driver stage operatively connected to said output stage and having an output terminal, wherein the input and driver stages included complementary transistors, the method of reducing the total harmonic distortion by matching the voltage dependant junction capacitances and operating currents of the input stage and driver stage transistors.

32. In an integrated circuit feedback amplifier including positive and negative input terminals, an input stage operatively connected to said input terminals, an output stage operatively connected to said input stage, and a driver stage operatively connected to said output stage and having an output terminal, wherein the driver and output stages included complementary transistors, the method of reducing the total harmonic distortion by matching the voltage dependent junction capacitances and operating currents of the driver stage and output stage transistors.

33. In a multiple stage integrated circuit feedback amplifier with complementary transistors in each stage thereof, each stage having both current sources and current sinks, a method of reducing the total harmonic distortion by closely matching the currents of the current sources and current sinks of all of the transistors in each stage.

* * * * *